(12) United States Patent
Chao et al.

(10) Patent No.: US 9,418,994 B1
(45) Date of Patent: Aug. 16, 2016

(54) FIN FIELD EFFECT TRANSISTOR (FINFET) DEVICE STRUCTURE

(71) Applicant: TAIWAN SEMICONDUCTOR MANUFACTURING CO., LTD., Hsin-Chu (TW)

(72) Inventors: Yi-Cheng Chao, Lukang Township, Changhua County (TW); Chai-Wei Chang, New Taipei (TW); Po-Chi Wu, Zhubei (TW); Jung-Jui Li, Hsinchu (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days.

(21) Appl. No.: 14/737,099

(22) Filed: Jun. 11, 2015

Related U.S. Application Data

(60) Provisional application No. 62/138,742, filed on Mar. 26, 2015.

(51) Int. Cl.

| | |
|---|---|
| *H01L 27/00* | (2006.01) |
| *H01L 29/00* | (2006.01) |
| *H01L 21/00* | (2006.01) |
| *H01L 27/088* | (2006.01) |
| *H01L 29/06* | (2006.01) |
| *H01L 29/66* | (2006.01) |
| *H01L 21/308* | (2006.01) |
| *H01L 21/02* | (2006.01) |
| *H01L 21/8234* | (2006.01) |

(52) U.S. Cl.
CPC ...... *H01L 27/0886* (2013.01); *H01L 21/02118* (2013.01); *H01L 21/3081* (2013.01); *H01L 21/823431* (2013.01); *H01L 21/823437* (2013.01); *H01L 29/0642* (2013.01); *H01L 29/0657* (2013.01); *H01L 29/6681* (2013.01)

(58) Field of Classification Search
CPC ............... H01L 21/823437; H01L 21/823431; H01L 21/02118; H01L 21/3081; H01L 27/0886; H01L 27/10879; H01L 27/1203; H01L 29/6681; H01L 29/0642; H01L 29/0657
See application file for complete search history.

(56) References Cited

U.S. PATENT DOCUMENTS

| | | | | |
|---|---|---|---|---|
| 8,665,629 | B2 * | 3/2014 | Park | H01L 27/228 365/148 |
| 8,748,989 | B2 * | 6/2014 | Lin | H01L 27/0924 257/353 |

(Continued)

FOREIGN PATENT DOCUMENTS

| | | |
|---|---|---|
| DE | 10 2012 106 901 A1 | 8/2013 |
| TW | 201442205 A | 11/2014 |

*Primary Examiner* — Nikolay Yushin
(74) *Attorney, Agent, or Firm* — Birch, Stewart, Kolasch & Birch, LLP

(57) ABSTRACT

A fin field device structure and method for forming the same are provided. The FinFET device structure includes a substrate, and the substrate includes a first region and a second region. The FinFET device structure includes an isolation structure formed on the substrate and first fin structures formed on the first region. The FinFET device structure also includes second fin structures formed on the second region, and the number of the first fin structures is greater than the number of the second fin structures. The first fin structures have a first height, the second fin structures have a second height, and a gap between the first height and the second height is in a range from about 0.4 nm to about 4 nm.

19 Claims, 20 Drawing Sheets

(56) References Cited

U.S. PATENT DOCUMENTS

| | | | |
|---|---|---|---|
| 8,941,153 B2* | 1/2015 | Lee | H01L 21/823431 257/288 |
| 2009/0085121 A1* | 4/2009 | Park | H01L 27/228 257/368 |
| 2009/0134454 A1 | 5/2009 | Takeuchi et al. | |
| 2011/0121406 A1* | 5/2011 | Lee | H01L 21/823431 257/401 |
| 2011/0260282 A1 | 10/2011 | Kawasaki | |
| 2013/0082333 A1 | 4/2013 | Chen et al. | |
| 2013/0093026 A1 | 4/2013 | Wann et al. | |
| 2013/0149826 A1 | 6/2013 | Lee et al. | |
| 2013/0221443 A1* | 8/2013 | Lin | H01L 27/0924 257/368 |

* cited by examiner

FIN FIELD EFFECT TRANSISTOR (FINFET) DEVICE STRUCTURE

CROSS REFERENCE TO RELATED APPLICATIONS

This Application claims the benefit of U.S. Provisional Application No. 62/138,742, filed on Mar. 26, 2015, and entitled "Fin field effect transistor (FinFET) device structure", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. Advantages of the FinFET may include reducing the short channel effect and higher current flow.

Although existing FinFET devices and methods of fabricating FinFET devices have generally been adequate for their intended purpose, they have not been entirely satisfactory in all aspects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2C' show a cross-sectional representation of another embodiment of FIG. 2C, in accordance with some embodiments of the disclosure.

FIG. 2H' show a cross-sectional representation of another embodiment of FIG. 2H, in accordance with some embodiments of the disclosure.

DETAILED DESCRIPTION

Figure 1:
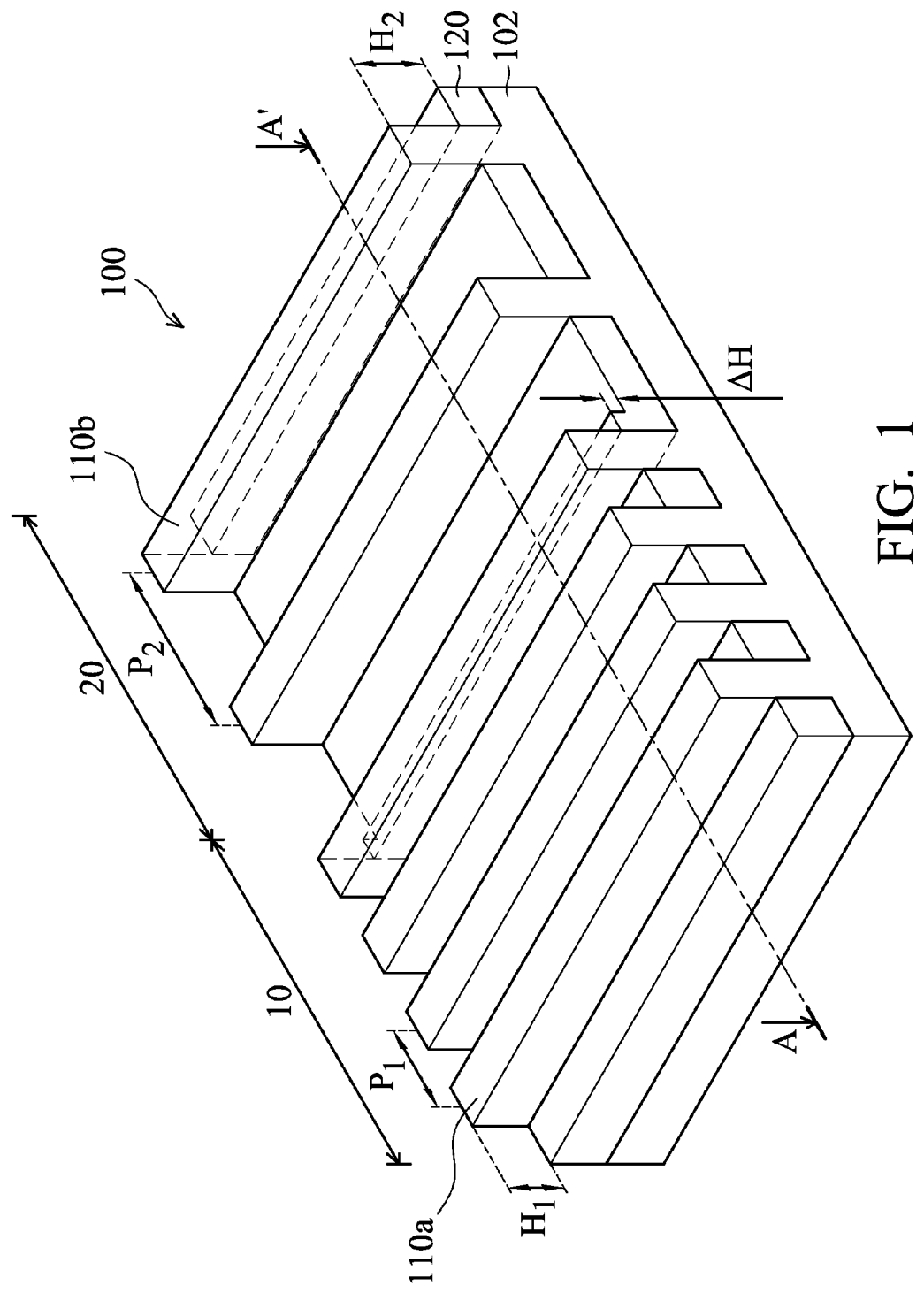
FIG. 1 shows a cross-sectional representation of a fin field effect transistor (FinFET) device structure, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a fin field effect transistor (FinFET) device structure are provided. FIG. 1 shows a cross-sectional representation of a fin field effect transistor (FinFET) device structure 100, in accordance with some embodiments of the disclosure.

Referring to FIG. 1, a substrate 102 is provided, and an isolation structure 120 is formed on the substrate 102. The isolation structure 120 prevents electrical interference or crosstalk. The substrate 102 has a first region 10 and a second region 20. The first fin structures 110a are formed on the substrate 102 in the first region 10, and the second fin structures 110b are formed on the substrate 102 in the second region 20. The first fin structures 110a are substantially parallel to each other. The second fin structures 110b are substantially parallel to each other.

The number of first fin structures 110a in the first region 10 is greater than the number of second fin structure 110b in the second region 20. In some embodiments, two adjacent first fin structures 110a have a first pitch $P_1$, two adjacent second fin structures 110b have a second pitch $P_2$, and the second pitch $P_2$ is greater than the first pitch $P_1$. In other words, the pattern density of the first fin structures 110a is greater than the pattern density of the second fin structure 110b.

Each of the first fin structures 110a has a top portion and a bottom portion, and the top portion is protruding from the isolation structure 120 and the bottom portion is embedded in the isolation structure 120. Each of the second fin structures 110b has a top portion and a bottom portion, and the top portion is protruding from the isolation structure 120 and the bottom portion is embedded in the isolation structure 120. It should be noted that the top surface of the first fin structures 110a is substantially level with the top surface of the second fin structures 110b.

Each of the first fin structures 110a has a first height $H_1$ which is measured from a top surface of the isolation structure 120 to a top surface of the first fin structures 110a. Each of the second fin structures 110b has a second height $H_2$ which is measured from a top surface of the isolation structure 120 to a top surface of the second fin structures 110b. In some embodiments, the first height $H_1$ is in a range from about 30 nm to about 50 nm. In some embodiments, the second height $H_2$ is in a range from about 30.1 nm to about 50.1 nm. In some embodiments, a gap $\Delta H$ between the first height $H_1$ and the second height $H_2$ is in a range from about 0.4 nm to about 4 nm. In some embodiments, a gap $\Delta H$ between the first height $H_1$ and the second height $H_2$ is in a range from about 1 nm to about 3 nm.

FIG. 2A-2H show cross-sectional representations of forming a fin field effect transistor (FinFET) device structure 100 along the line AA' of FIG. 1, in accordance with some embodiments of the disclosure.

Figure 2A:
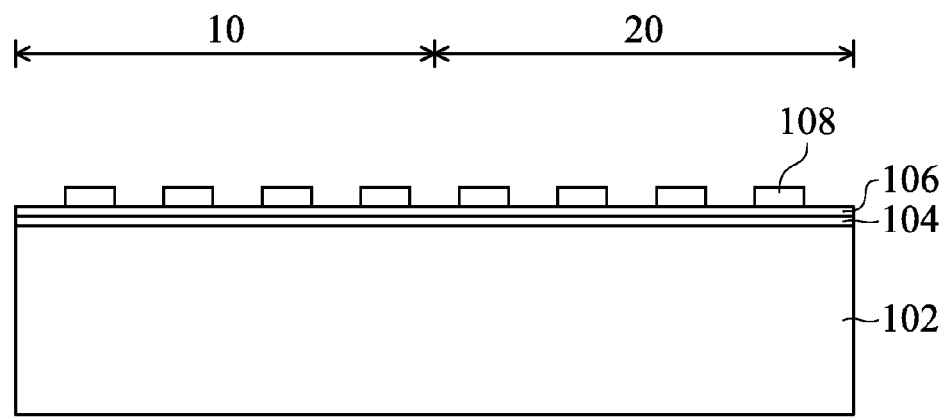
FIGS. 2A-2H show cross-sectional representations of forming a fin field effect transistor (FinFET) device structure, in accordance with some embodiments of the disclosure.

As shown in FIG. 2A, the FinFET device structure 100 includes a substrate 102. The substrate has a first region 10 and a second region 20. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Afterwards, a pad layer 104 and a hard mask layer 106 are formed on the substrate 102, and a photoresist layer 108 is formed on the hard mask layer 106. The photoresist layer 108 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process The pad layer 104 is a buffer layer between the substrate 102 and the hard mask layer 106. In addition, the pad layer 104 is used as a stop layer when the hard mask layer 106 is removed. The pad layer 104 may be made of silicon oxide. The hard mask layer 106 may be made of silicon oxide, silicon nitride, silicon oxynitride, or another applicable material. In some other embodiments, more than one hard mask layer 106 is formed on the pad layer 104.

The pad layer 104 and the hard mask layer 106 are formed by deposition processes, such as a chemical vapor deposition (CVD) process, high-density plasma chemical vapor deposition (HDPCVD) process, spin-on process, sputtering process, or another applicable process.

Figure 2B:
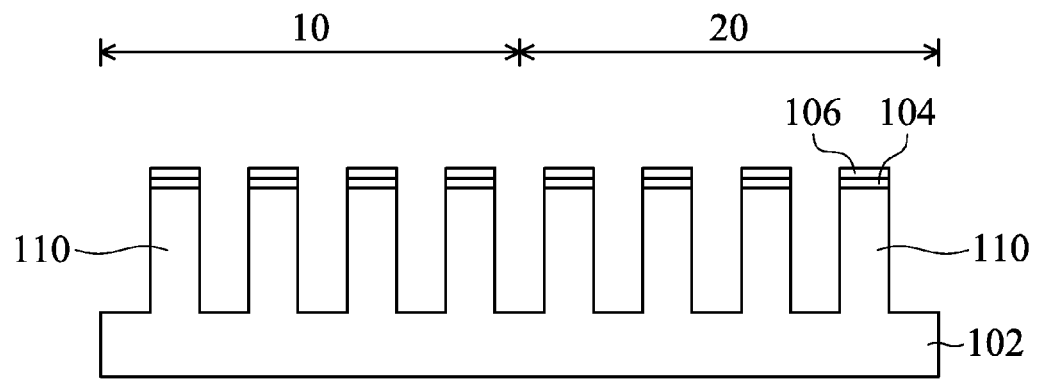

After the photoresist layer 108 is patterned, the pad layer 104 and the hard mask layer 106 are patterned by using the patterned photoresist layer 108 as a mask as shown in FIG. 2B, in accordance with some embodiments. As a result, a patterned pad layer 104 and a patterned hard mask layer 106 are obtained.

Afterwards, an etching process is performed on the substrate 102 to form a fin structure 110 by using the patterned pad layer 104 and the patterned hard mask layer 106 as a mask. The etching process may be a dry etching process or a wet etching process. In some embodiments, the substrate 102 is etched by a dry etching process. The dry etching process includes using the fluorine-based etchant gas, such as $SF_6$, $C_xF_y$, $NF_3$ or combinations thereof. The etching process may be a time-controlled process, and continue until the fin structures 110 reach a predetermined height. In some other embodiments, the fin structures 110 have a width that gradually increases from the top portion to the lower portion.

Figure 2C:
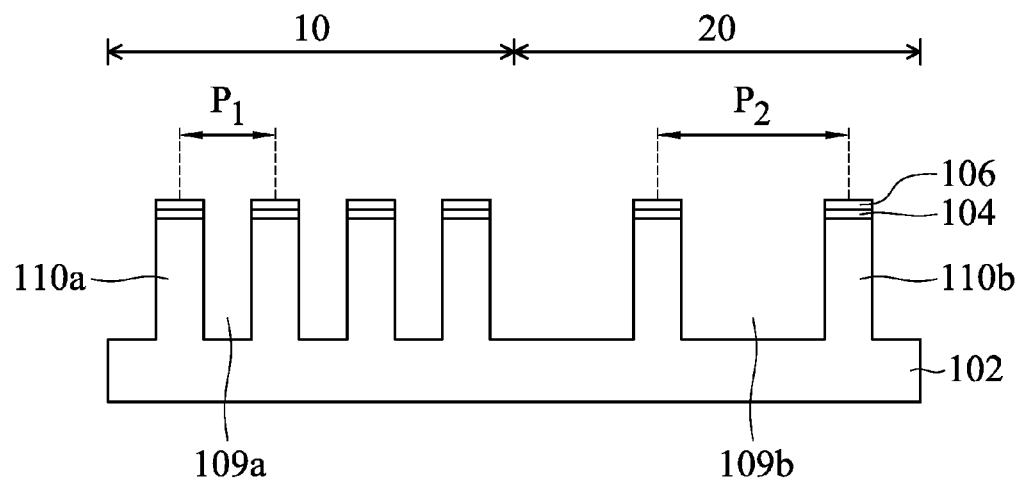
Figure 2C:
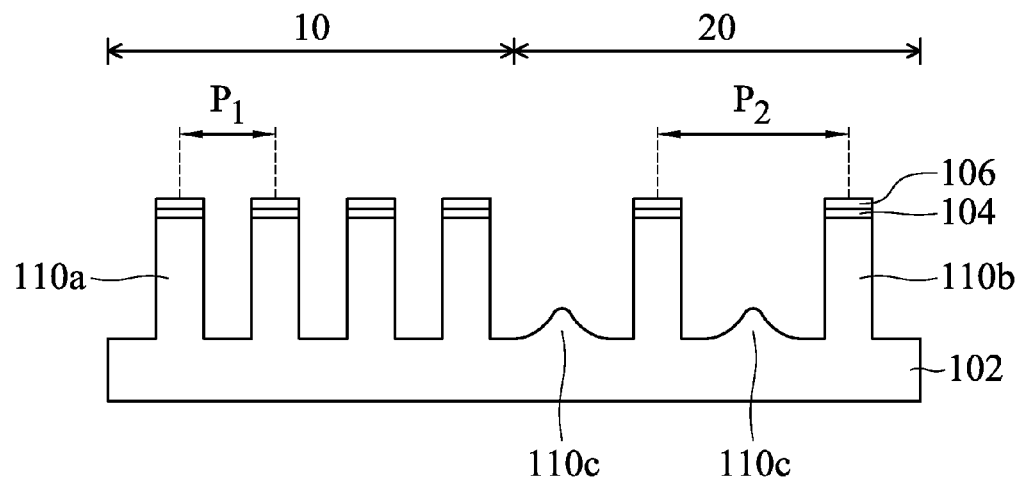

After the fin structures 110 are formed, the photoresist layer 108 is removed and a portion of the fin structures 110 in the second region 20 is removed as shown in FIG. 2C, in accordance with some embodiments. Therefore, the first fin structures 110a are formed in the first region 10 and the second fin structures 110b are formed in the second region 20. The first trenches 109a are formed between two adjacent first fin structures 110a, and the second trench 109b are formed between two adjacent second fin structures 110b.

It should be noted that the pattern density of the first fin structures 110a in the first region 10 is greater than the pattern density of the second fin structure 110b in the second region 20. The devices formed in the first region 10 and the devices formed in second region 20 respectively and independently perform different function.

As shown in FIG. 2C, two adjacent first fin structures 110a have the first pitch $P_1$, and two adjacent second fin structures 110b have the second pitch $P_2$. The second pitch $P_2$ is greater than the first pitch $P_1$. In other words, the width of the second trench 109b in the second region 20 is greater than that of the first trench 109a in the first region 10.

In some other embodiments, as shown in FIG. 2C', the removed portions of the fin structures 110 are not completely removed, the remaining fin portions 110c are formed adjacent to the second fin structures 110b. In some embodiments, the height of the remaining fin portions 110c is lower than one half of the height of the first fin structures 110a.

It should be noted that the number of first fin structures 110a and second fin structures 110b may be adjusted according to actual application, and it is not limited to four first fin structures 110a in the first region 10 and two second fin structures 110 in the second region 20.

Figure 2D:
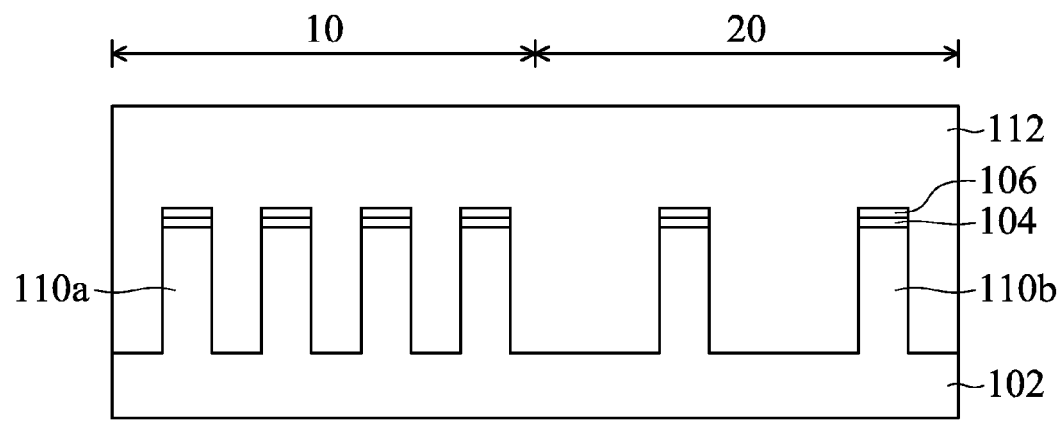

After the first fin structures 110a and the second fin structures 110b are formed, a dielectric material 112 is formed in the first trenches 109a and the second trenches 109b between two adjacent first fin structures 110a and the second fin structures 110b and formed on the first fin structures 110a and the second fin structures 110b as shown in FIG. 2D, in accordance with some embodiments.

In some embodiments, the dielectric material 112 is made of silicon oxide, silicon nitride, silicon oxynitride, fluoride-doped silicate glass (FSG), or another low-k dielectric material. The dielectric material 112 may be deposited by a chemical vapor deposition (CVD) process, a spin-on-glass process, or another applicable process.

Figure 2E:
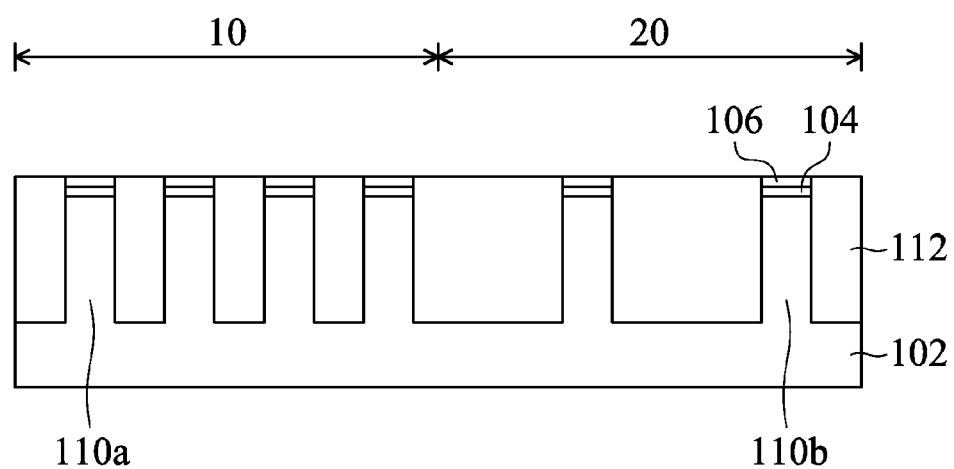

Afterwards, the dielectric material 112 is thinned or planarized to expose the top surface of the hard mask layer 106 as shown in FIG. 2E, in accordance with some embodiments. As a result, the top surface of the dielectric material 112 is level with the top surface of the hard mask layer 106. In some embodiments, the dielectric material 112 is thinned by a chemical mechanical polishing (CMP) process.

Figure 2F:
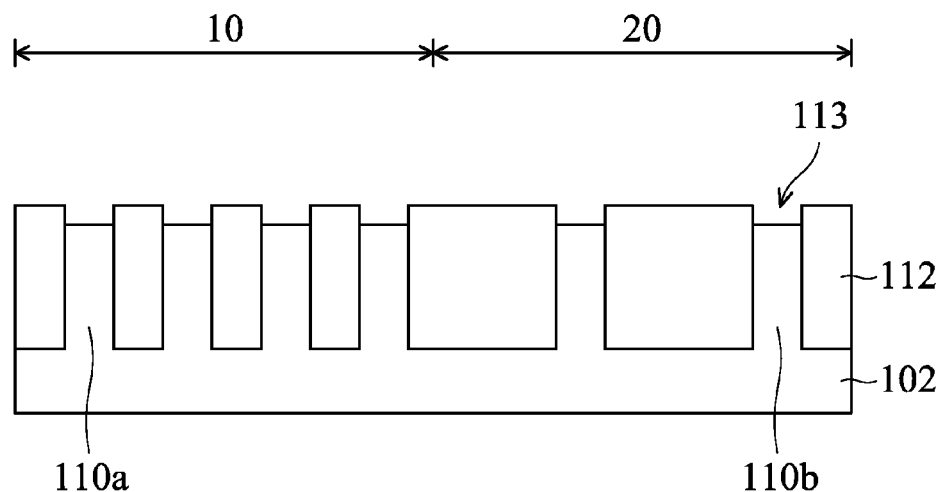

After the dielectric material 112 is thinned or planarized, the hard mask layer 106 and the pad layer 104 are removed to form recesses 113 as shown in FIG. 2F, in accordance with some embodiments. The hard mask layer 106 and the pad layer 104 are removed by an etching process, such as a dry etching process or a wet etching process.

Figure 2G:
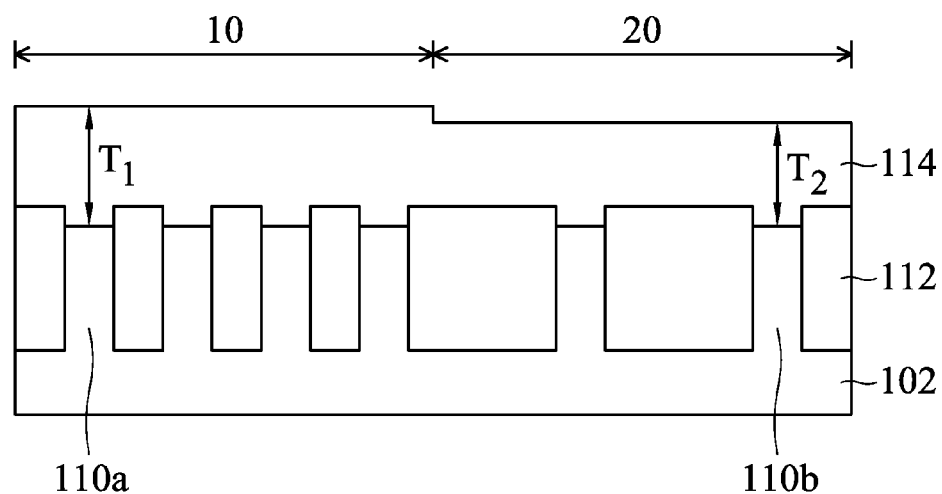

After the recesses 113 are formed, a sacrificial layer 114 is formed in the recesses 113 and on the dielectric material 112 as shown in FIG. 2G, in accordance with some embodiments. The sacrificial layer 114 is used to protect the top surface of the first fin structures 110a and the second fin structures 110b. The sacrificial layer 114 may have a single layer or multiple layers. The sacrificial layer 114 is made of silicon oxide, silicon nitride, silicon oxynitride or combinations thereof.

In some other embodiments, after the sacrificial layer 114 is formed, an ion implant process (not shown) is optionally performed on the top surface of the fin structure 110. The ion implant process is configured to dope the channel region with dopants, and the channel region is formed below a gate structure (formed later).

For regions with different exposed areas (or etched areas), it is difficult to control etching uniformity due to the loading effect. Depending on the integration of fin structures and etching strategy, the loading effect is the etching rate for a larger exposed area being either faster or slower than it is for a smaller exposed area. In other words, the loading effect is that the etching rate in large area is mismatched the etching rate in small area. This means that the loading effect may be affected by the pattern density. Therefore, while etching the first fin structures 110a and the second fin structures 110b with different pattern density in different regions 10, 20, it is more difficult to control the uniformity of the etching depth.

In order to reduce the loading effect, the sacrificial layer 114 is over-deposited on the first fin structures 110a and the second fin structures 110b. In other words, the deposition thickness of the sacrificial layer 114 is higher than normal thickness (may be less about 5 nm).

The thickness of the sacrificial layer 114 is maintained within a range to reduce the loading effect. In some embodiments, the sacrificial layer 114 has a first thickness $T_1$ in the first region 10 and a second thickness $T_2$ in the second region 20. In some embodiments, the first thickness $T_1$ is in a range from about 10 nm to about 50 nm. In some embodiments, the second thickness $T_2$ is in a range from about 10 nm to about 50 nm. If the first thickness $T_1$ or the second thickness $T_2$ is smaller than 10 nm, the etching time is too short and it is difficult to maintain the amount etched within the expected range and therefore the dielectric layer 112 is over-etched. If the first thickness $T_1$ or the second thickness $T_2$ is greater than 50 nm, the etching time is too long and therefore fabrication cost is increased.

Figure 2H:
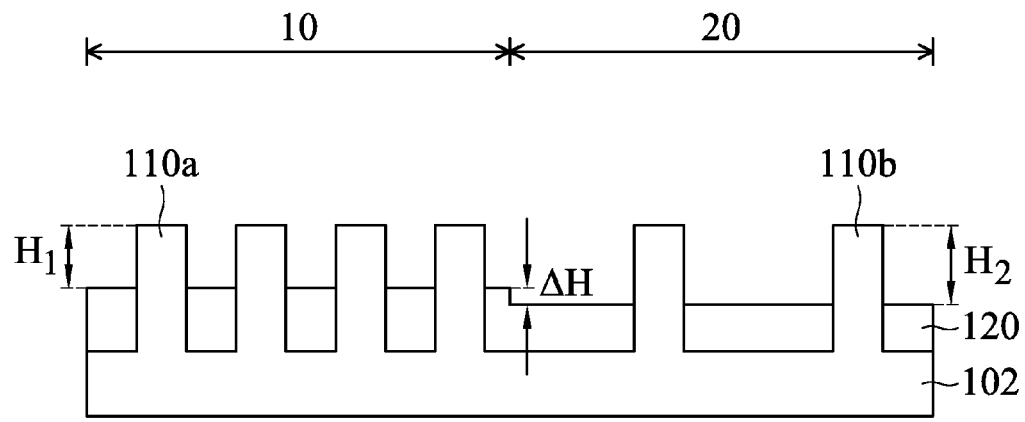
Figure 2H:
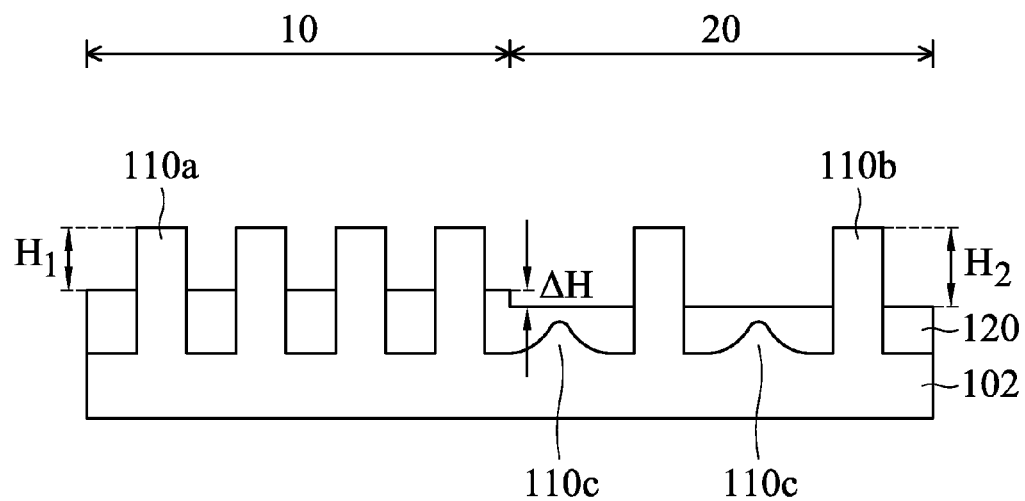

Afterwards, the sacrificial layer 114 is removed as shown in FIG. 2H, in accordance with some embodiments. Afterwards, a top portion of the dielectric material 112 is removed to form the isolation structure 120. In some embodiments, the sacrificial layer 114 is removed by an etching process. In some embodiments, the top portion of the dielectric material 112 is removed by another etching process. The remaining dielectric material 112 is seen as a shallow trench isolation (STI) structure 120.

A top portion of the first fin structures 110a is exposed, and the top portion has a first height $H_1$ which is measured from a top surface of the isolation structure 120 to a top surface of the first fin structures 110a. Likewise, a top portion of the second fin structures 110b is exposed, and the top portion has a second height $H_2$ which is measured from a top surface of the isolation structure 120 to a top surface of the second fin structures 110b.

In some embodiments, a gap $\Delta H$ between the first height $H_1$ and the second height $H_2$ is in a range from about 0.4 nm to about 4 nm. If the gap $\Delta H$ between the first height $H_1$ and the second height $H_2$ is larger than 4 nm, the uniformity of thickness of the deposited layers (such as, the gate dielectric layer and the gate electrode layer) which may formed by the following operations on the first fin structure 110a and the second fin structures 110b is difficult to control. In contrast, when the gap $\Delta H$ kept within a range from about 0.4 nm to about 4 nm, the uniformity of the thickness of the deposited layers is improved, and therefore the performance of FinFET structure is also improved.

In some embodiments, a ratio ($T_1/H_1$) of first thickness $T_1$ to the first height $H_1$ is in a range from about 0.2 to about 0.5. If the ratio is larger than 0.5, the excess sacrificial layer 114 may be wasted, and fabrication cost is high. If the ratio is smaller than 0.2, the loading effect may be serious.

FIG. 2H' show a cross-sectional representation of another embodiment of FIG. 2H, in accordance with some embodiments of the disclosure. As shown in FIG. 2H', the remaining fin structures 110c are completely covered by the isolation structure 120.

Figure 3A:
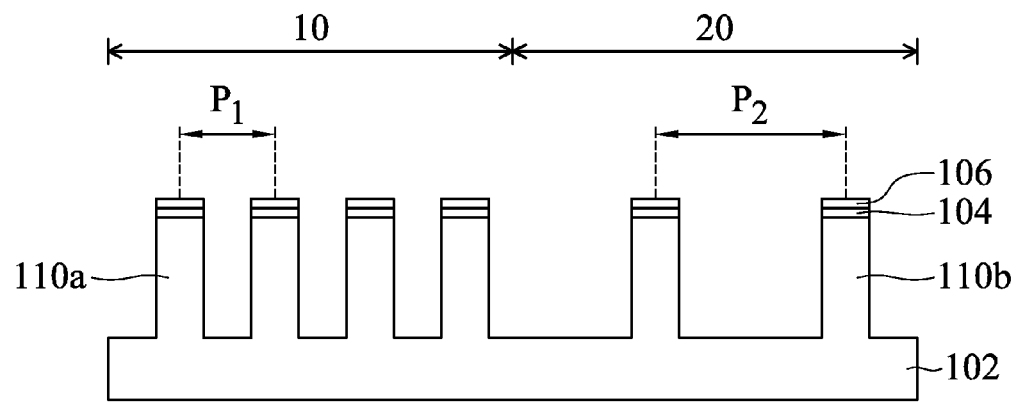
FIGS. 3A-3C show cross-sectional representations of forming a fin field effect transistor (FinFET) device structure, in accordance with some embodiments of the disclosure.
Figure 3B:
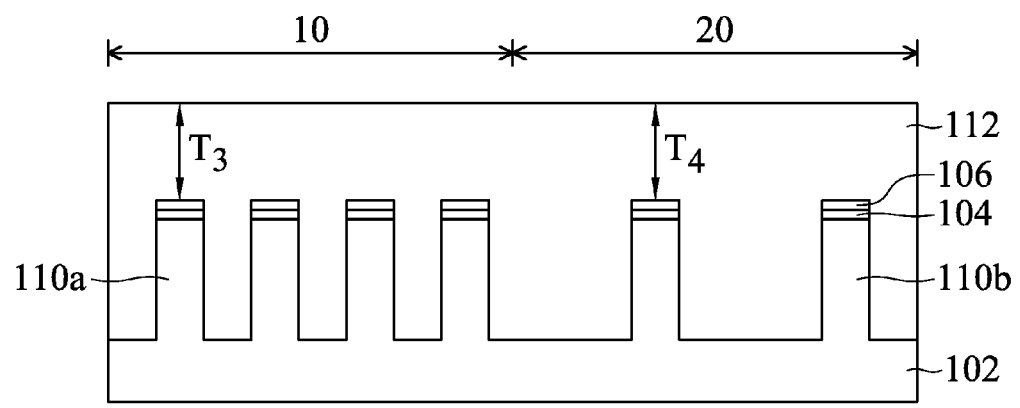
Figure 3C:
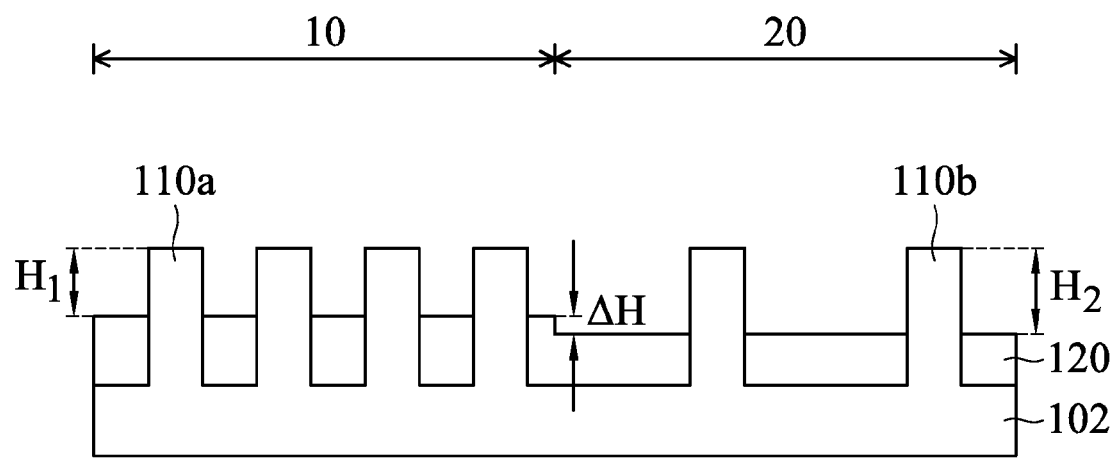

FIGS. 3A-3C show cross-sectional representations of forming a fin field effect transistor (FinFET) device structure, in accordance with some embodiments of the disclosure.

Referring to FIG. 3A, the first fin structures 110a are formed on the substrate 102 in the first region 10, and the second fin structures 110b are formed on the substrate 102 in the second region 20.

Afterwards, a dielectric layer 112 is formed on the first fin structures 110a and the second fin structures 110b as shown in FIG. 3B, in accordance with some embodiments of the disclosure. The dielectric layer 112 is over-deposited on the first fin structures 110a and the second fin structures 110b. As mentioned above, the loading effect between the first region 10 and the second region 20 are reduced by forming the over-deposited dielectric layer 112.

After the dielectric layer 112 is formed, an etching process is performed to remove the dielectric layer 112 as shown in FIG. 3C, in accordance with some embodiments of the disclosure. In addition, the pad layer 104 and a hard mask layer are also removed. As a result, each of the first fin structures 110a in the first region 10 has a first height $H_1$, and each of the second fin structures 110b in the second region 20 has a second fin height $H_2$. In some embodiments, a gap $\Delta H$ between the first height $H_1$ and the second height $H_2$ is in a range from about 0.4 nm to about 4 nm. In some embodiments, a gap $\Delta H$ between the first height $H_1$ and the second height $H_2$ is in a range from about 1 nm to about 3 nm.

FIGS. 4A-4G show cross-sectional representations of forming a fin field effect transistor (FinFET) device structure, in accordance with some embodiments of the disclosure.

Figure 4A:
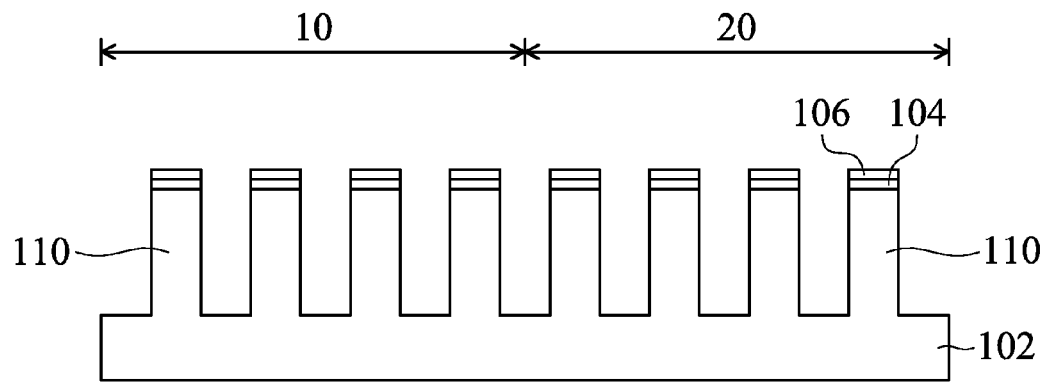
FIGS. 4A-4G show cross-sectional representations of forming a fin field effect transistor (FinFET) device structure, in accordance with some embodiments of the disclosure.

Referring to FIG. 4A, the fin structures 110 are formed on the substrate 102. The number of fin structures 110 in the first region 10 is the same as that in the second region 20.

Figure 4B:
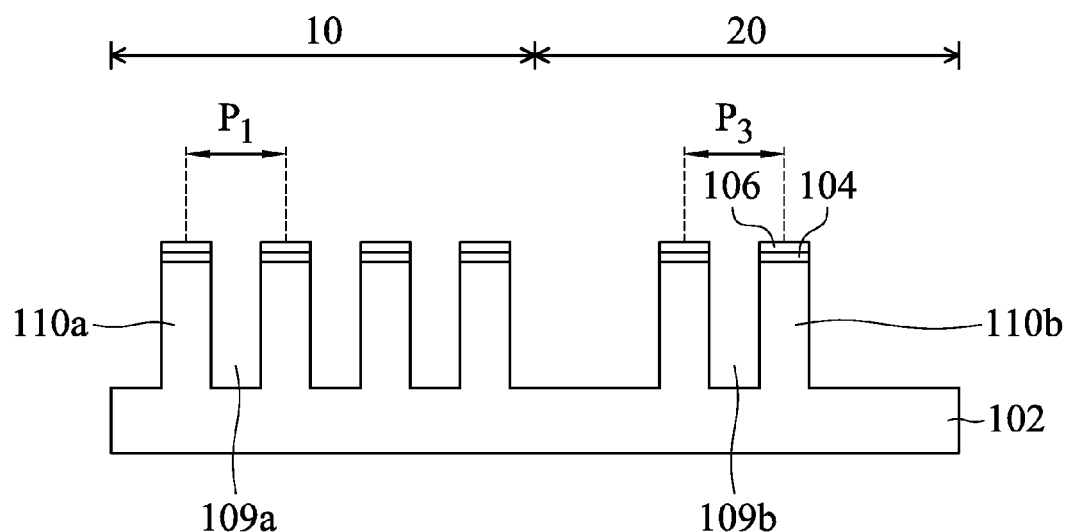

After the fin structures 110 are formed, a portion of the second fin structures 110b in the second region 20 is removed as shown in FIG. 4B, in accordance with some embodiments of the disclosure. For example, the number of second fin structures 110b is reduced from four to two.

The two adjacent first fin structures 110a have the first pitch $P_1$, and two adjacent second fin structures 110b have a third pitch $P_3$. In some embodiments, the first pitch $P_1$ is substantially equal to the third pitch $P_3$. The number of first fin structures 110a is greater than that of the second fin structures 110b, and the area of the first region 10 is the same as that of the second region 20. Therefore, the pattern density of the first fin structures 110a in the first region 10 is greater than that of the second fin structures 110b in the second region 20.

Figure 4C:
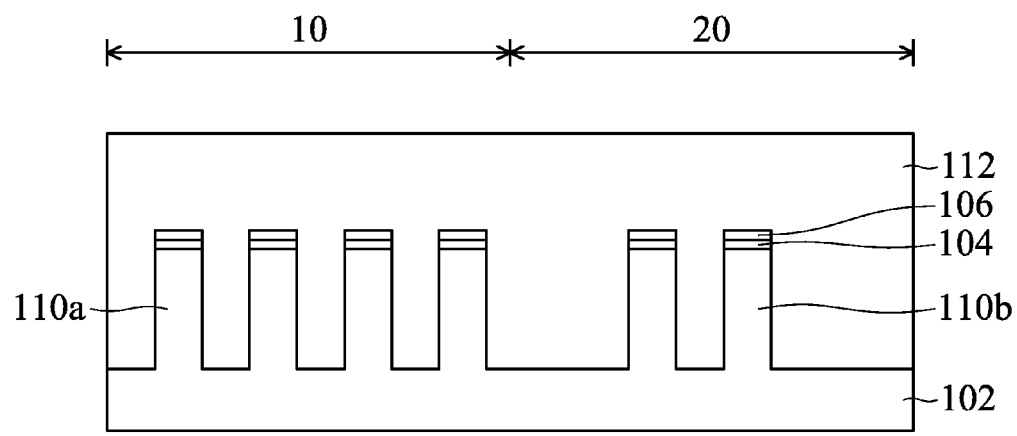

After the first fin structures 110a and the second fin structures 110b are formed, a dielectric layer 112 is formed on the first fin structures 110a and the second fin structures 110b and the trench between two adjacent the first fin structures 110a and the second fin structures 110b as shown in FIG. 4C, in accordance with some embodiments of the disclosure.

Figure 4D:
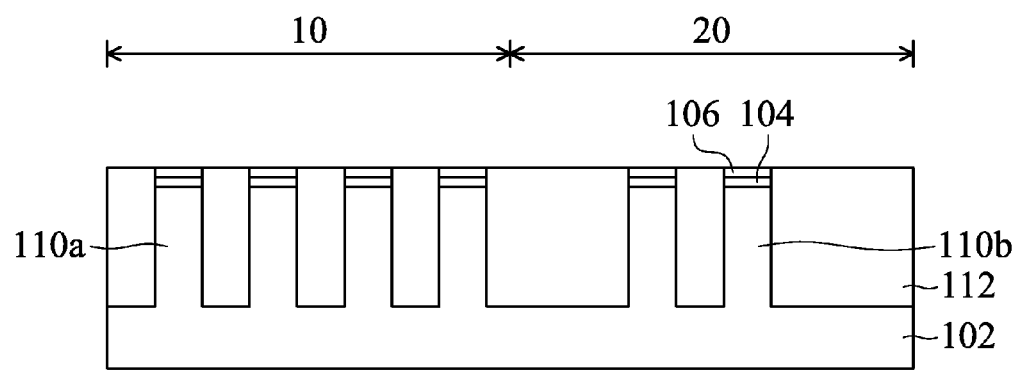

After the dielectric layer 112 is formed, a planarizing process is performed on the dielectric layer 112 until the top surface of the hard mask layer 106 is exposed as shown in FIG. 4D, in accordance with some embodiments of the disclosure. In some embodiments, the planarizing process is a chemical mechanical polishing process (CMP).

Figure 4E:
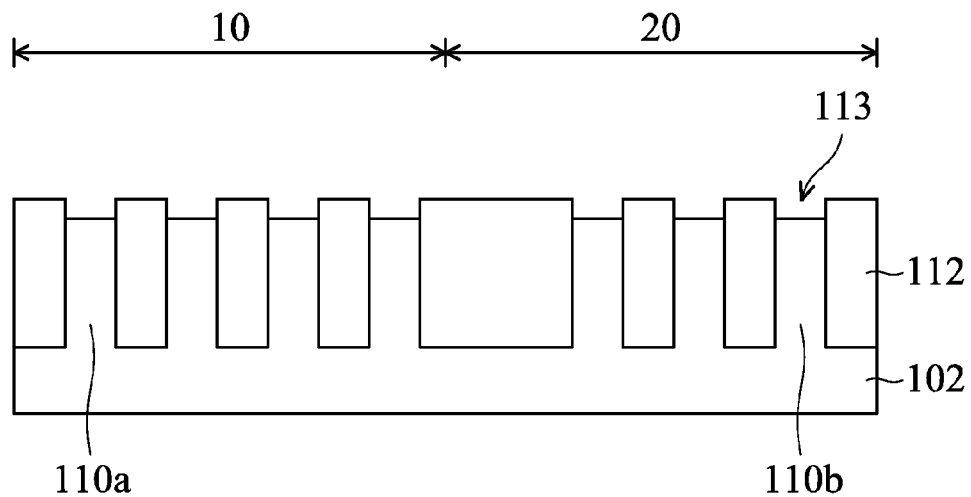

Afterwards, the hard mask layer 106 and the pad layer 104 are removed as shown in FIG. 4E, in accordance with some embodiments of the disclosure. The hard mask layer 106 and the pad layer 104 are independently removed by multiple etching processes.

Figure 4F:
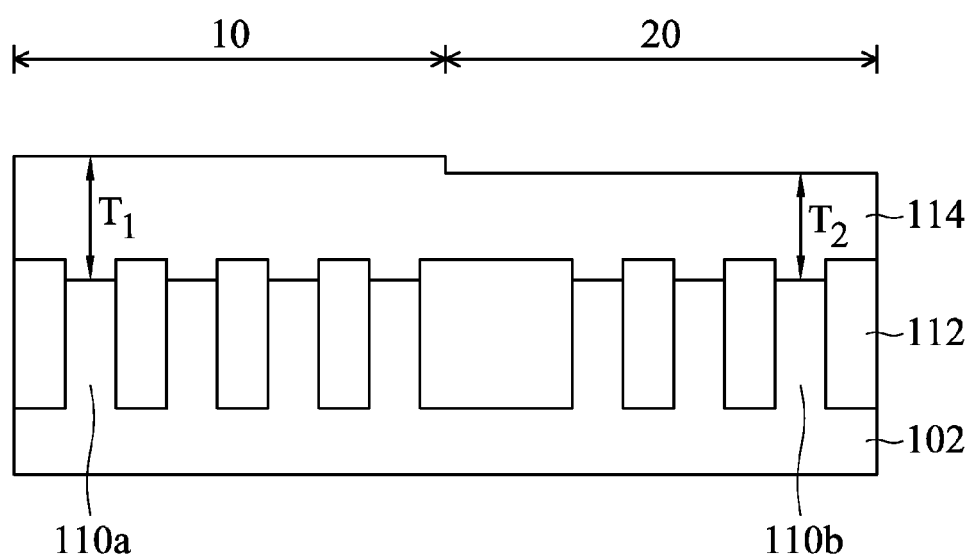

Afterwards, the sacrificial layer 114 is formed in the recesses 113 and on the dielectric material 112 as shown in FIG. 4F, in accordance with some embodiments of the disclosure. As mentioned above, the sacrificial layer 114 is over-deposited, and therefore the loading effect is reduced. As a consequence, the uniformity of the fin height is improved.

Figure 4G:
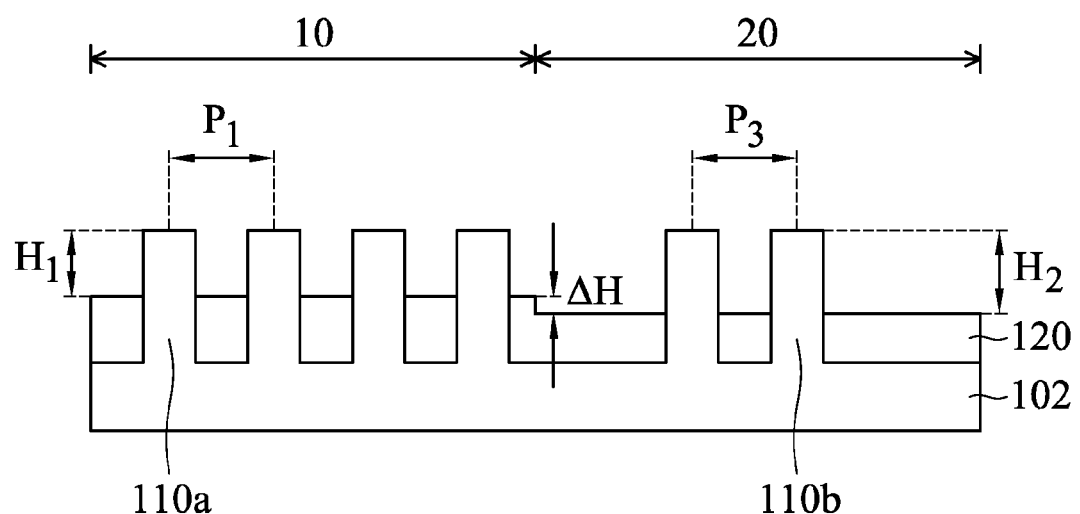

Afterwards, the sacrificial layer 114 is removed as shown in FIG. 4G, in accordance with some embodiments of the disclosure.

The first fin structures 110a in the first region 10 has a first height $H_1$, and the second fin structures 110b in the second region 20 has a second height $H_2$. The height difference between the first height $H_1$ and the second $H_2$ is defined as $\Delta H$. Since the loading effect is reduced, the height difference $\Delta H$ is also reduced. When the height difference $\Delta H$ is reduced, the uniformity of the height of the first fin structures 110a and the second fin structures 110b is improved. Therefore, the performance of the FinFET structure is improved.

Figure 5A:
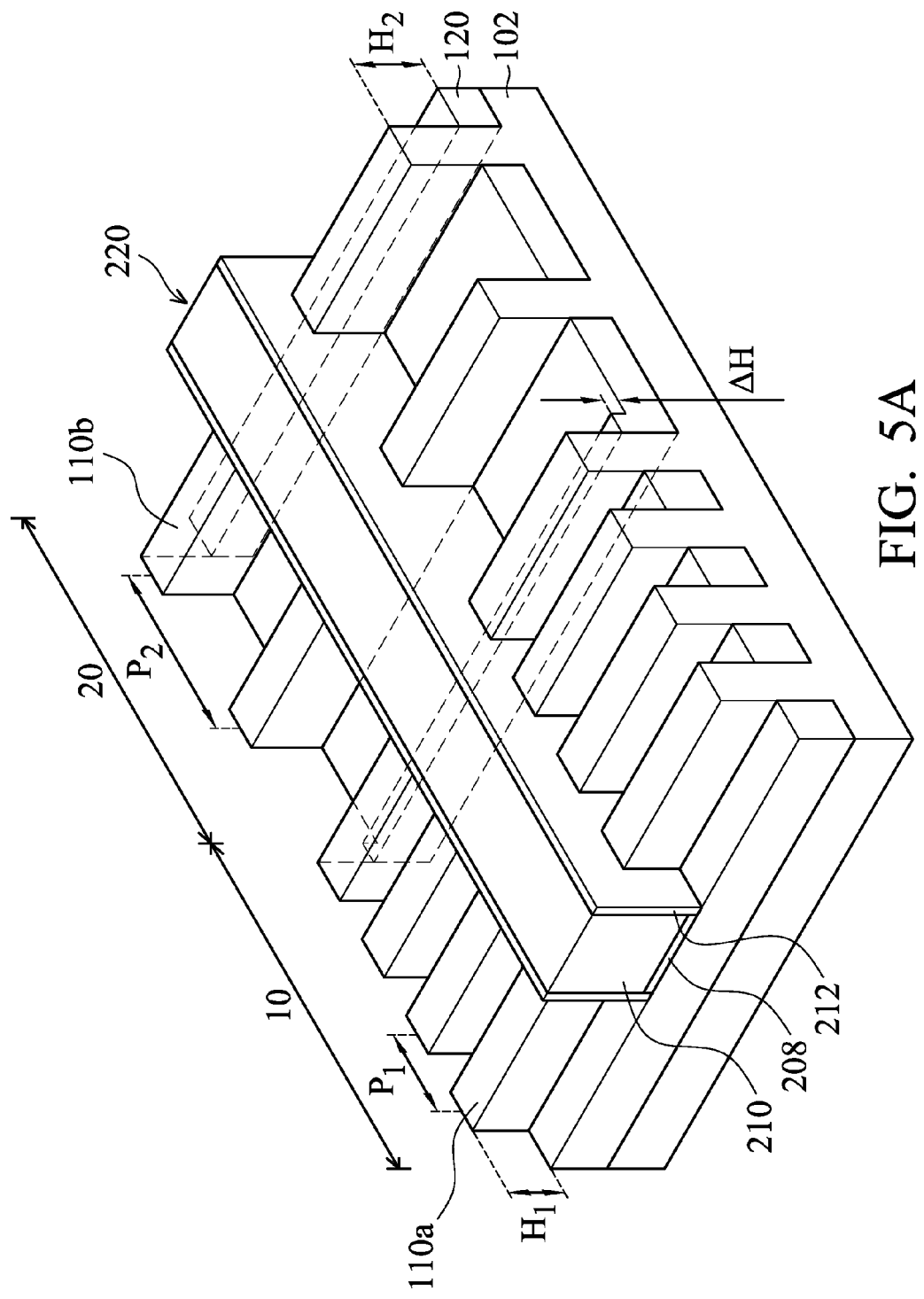
FIGS. 5A-5B show cross-sectional representations of forming a gate structure on the fin structures, in accordance with some embodiments of the disclosure.
Figure 5B:
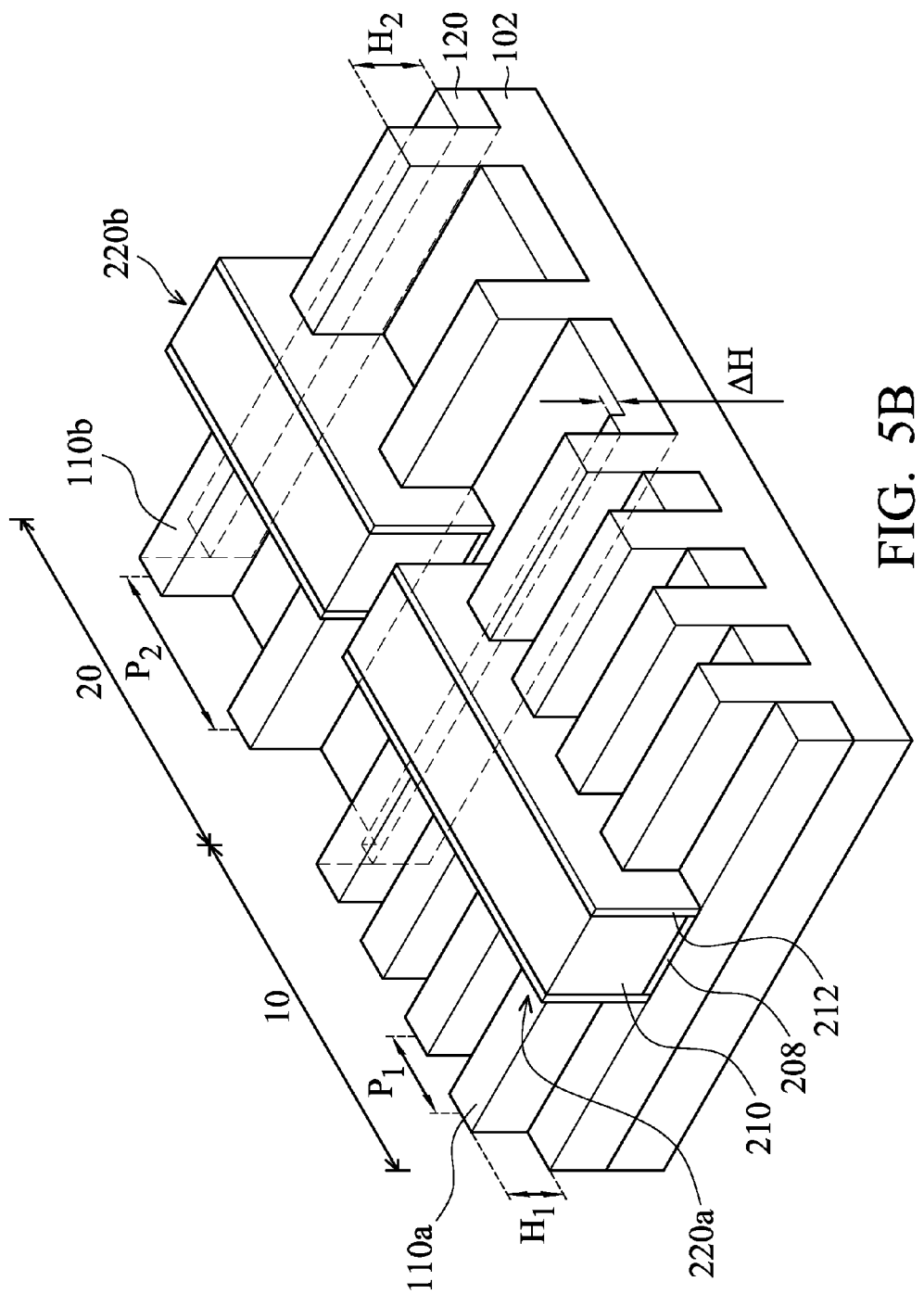

FIGS. 5A-5B show cross-sectional representations of forming a gate structure on the fin structures, in accordance with some embodiments of the disclosure.

As shown in FIG. 5A, a gate structure 220 is formed on the middle portion of the first fin structures 110a and the second fin structures 110b. The gate structure includes a gate dielectric layer 208 and a gate electrode layer 210. The gate spacers 212 are formed on opposite sidewalls of the first fin structures 110a and the second fin structures 110b.

The gate dielectric layer 208 is made of dielectric materials, such as silicon oxide, silicon nitride, silicon oxynitride, dielectric material(s) with high dielectric constant (high-k), or combinations thereof. The gate dielectric layer 208 is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

In some embodiments, the gate electrode layer 210 is made of conductive or non-conductive materials. In some embodiments, the gate structure 220 is a dummy gate structure, and the gate electrode layer 210 is made of polysilicon. The gate electrode layer 210 is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

As shown in FIG. 5B, a portion of the gate structure 220 is removed, and therefore a first gate structure 220a is formed in the first region 10 and a second gate structure 220b is formed in the second region 20. The top surface of the first gate structure 220a is substantially level with a top surface of the second gate structures 220b.

FIGS. 6A-6F show cross-sectional representations of forming a fin structure, in accordance with some embodiments of the disclosure.

Figure 6A:
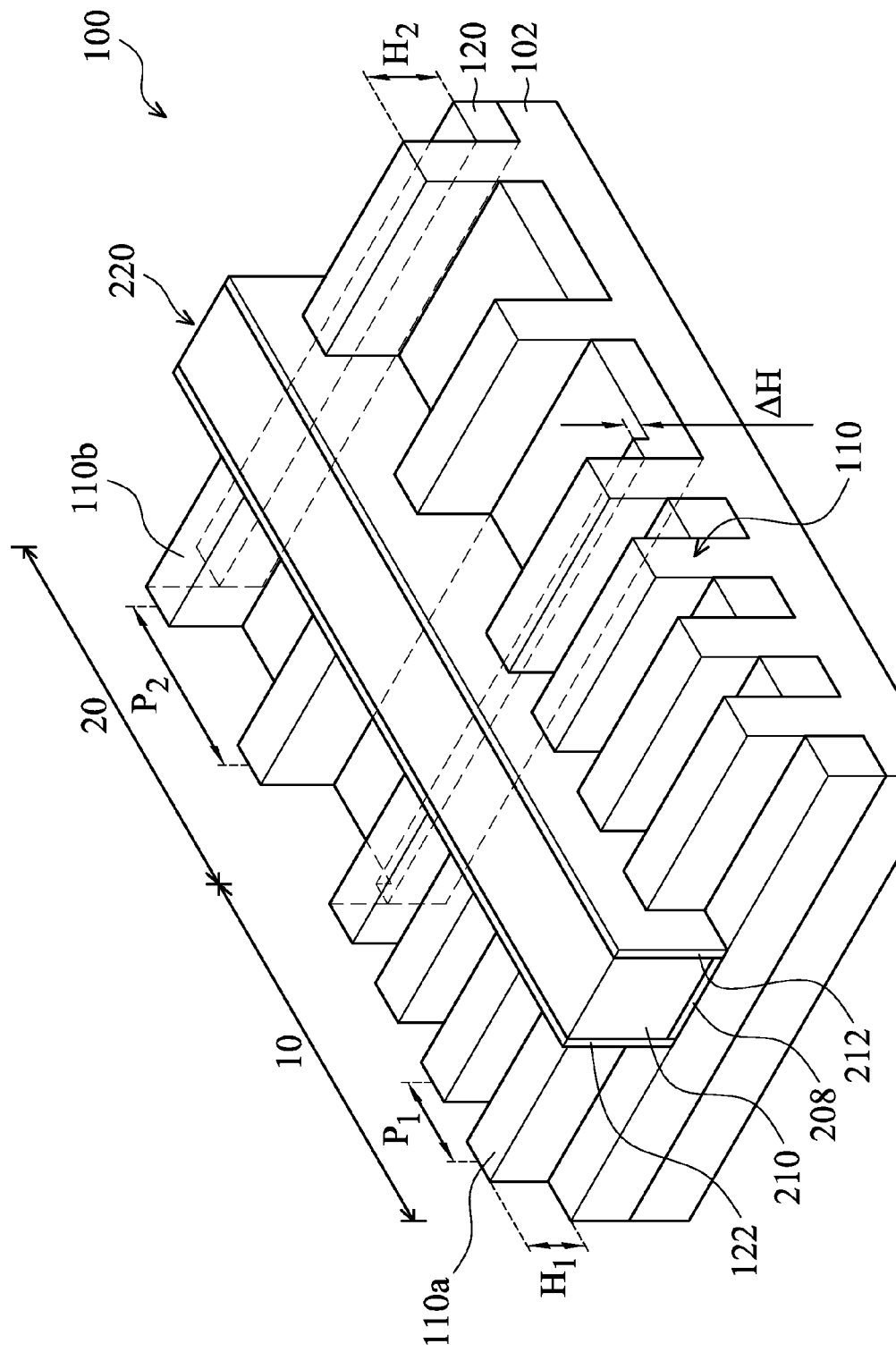
FIGS. 6A-6F show cross-sectional representations of forming a fin field effect transistor (FinFET) device structure, in accordance with some embodiments of the disclosure.

As shown in FIG. 6A, the gate structures 220 are dummy gate structures. The dummy gate structures 220 will be removed and be replaced by the real gate structures. Each of the dummy gate structures 220 includes a dummy gate dielectric layer 208 and a dummy gate electrode 210.

Figure 6B:
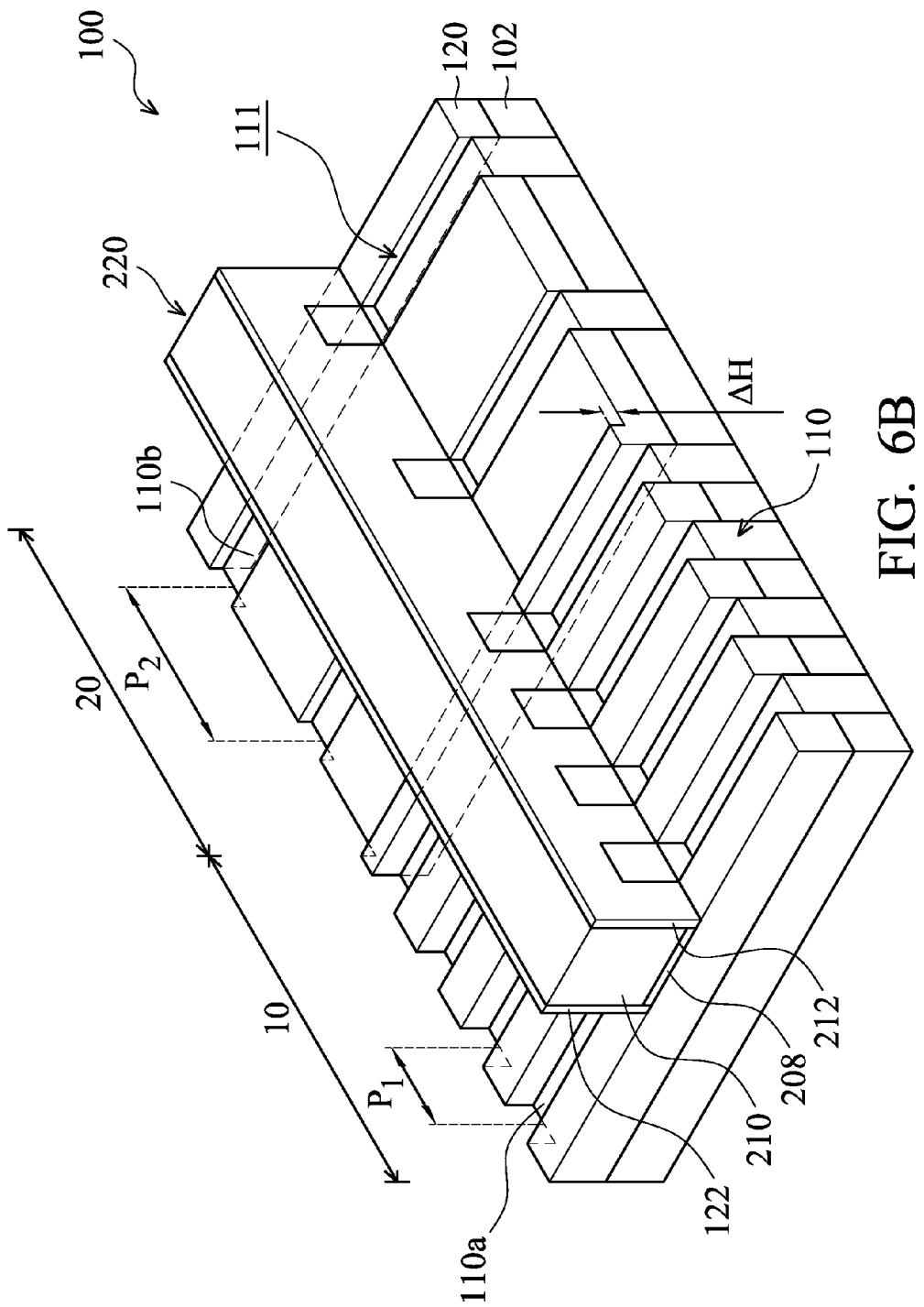

Afterwards, the cavities 111 are formed by removing a top portion of the first fin structures 110 and the second fin structures 110b as shown in FIG. 6B, in accordance with some embodiments of the disclosure.

Figure 6C:
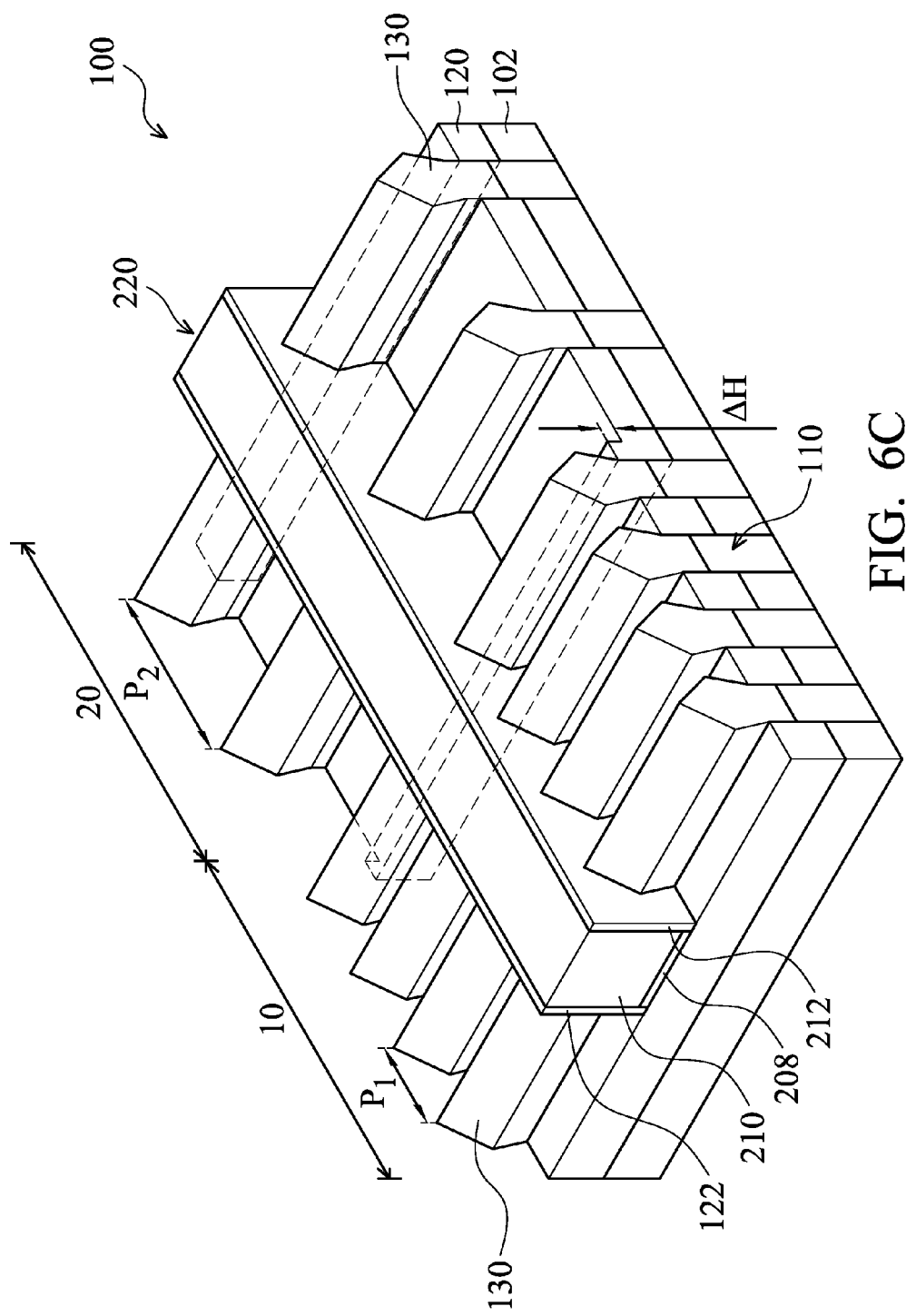

After the cavities 111 are formed, the source/drain (S/D) structures 130 are formed in the cavities 111 as shown in FIG. 6C, in accordance with some embodiments.

In some embodiments, the source/drain structures 130 are strained source/drain structures. In some embodiments, the source/drain structures 130 include silicon germanium (SiGe), germanium (Ge), indium arsenide (InAs), indium gallium arsenide (InGaAs), indium antimonide (InSb), gallium arsenide (GaAs), gallium antimonide (GaSb), indium aluminum phosphide (InAlP), indium phosphide (InP), or a combination thereof.

In some embodiments, the source/drain (S/D) structures 130 are formed by growing a strained material on the first fin structures 110 and the second fin structures 110b by an epitaxial (epi) process. In addition, the lattice constant of the strained material may be different from the lattice constant of the substrate 102. The epitaxial process may include a selective epitaxy growth (SEG) process, CVD deposition techniques (e.g., vapor-phase epitaxy (VPE) and/or ultra-high vacuum CVD (UHV-CVD)), molecular beam epitaxy, or other suitable epi processes.

Figure 6D:
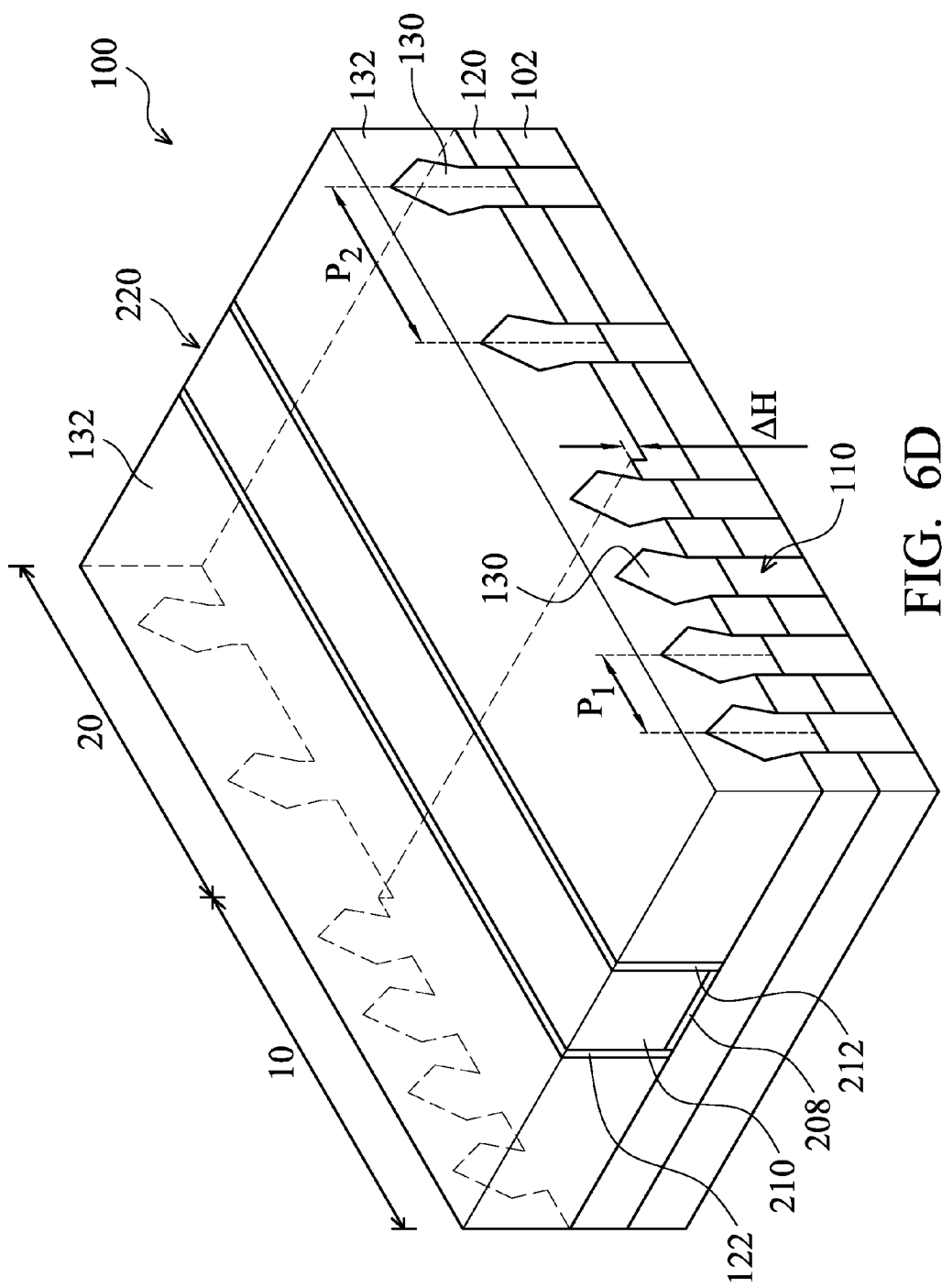

Afterwards, an inter-layer dielectric (ILD) structure 132 is formed over the S/D structures 130 over the substrate 102 as shown in FIG. 6D, in accordance with some embodiments.

In some embodiments, an inter-layer dielectric (ILD) material is formed over the isolation structure 120 and the dummy gate structure 220. Afterwards, a polishing process is performed to the ILD material until the top surface of dummy gate structure 220 is exposed. In some embodiments, the ILD material is planarized by a chemical mechanical polishing (CMP) process. As a result, the ILD structure 132 is formed. In some other embodiments, a contact etch stop layer (CESL) (not shown) is formed before the ILD structure 132 is formed.

The ILD structure 132 includes a first portion located between two adjacent first fin structures 110a and a second portion located between two adjacent second fin structures 110b. It should be noted that a gap between a top surface of the first portion of the ILD structure 132 and that of the second portion of the ILD structure 132. In some embodiments, the gap is in a range from about 0.4 nm to about 4 nm. In some embodiments, the gap is in a range from about 1 nm to about 3 nm.

The inter-layer dielectric (ILD) material may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The inter-layer dielectric (ILD) material may be formed by chemical vapor deposition (CVD), physical vapor deposition, (PVD), atomic layer deposition (ALD), spin-on coating, or other applicable processes.

Figure 6E:
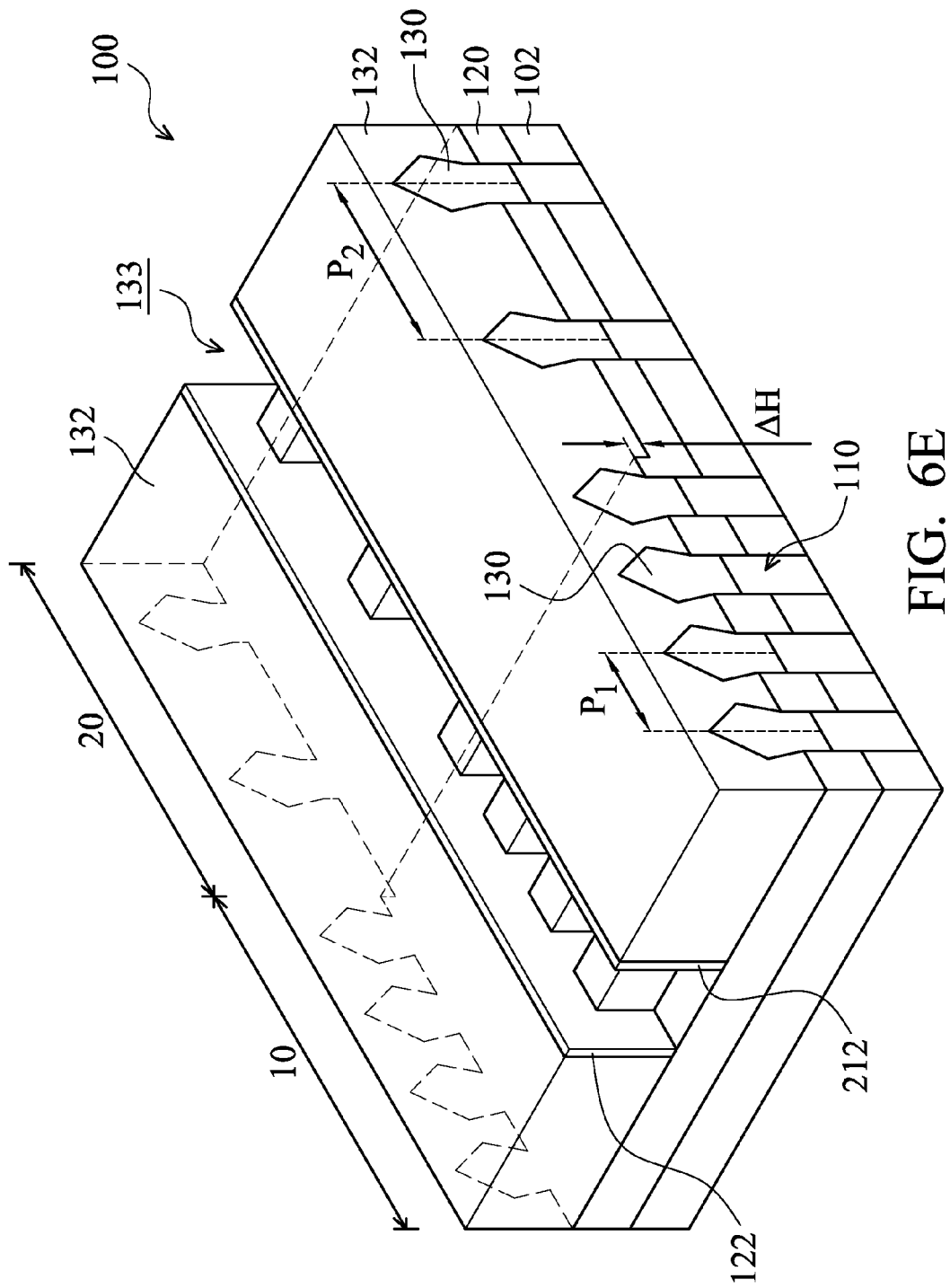

After the ILD structure 132 is formed, the dummy gate structure 220 is removed to form the trenches 133 in the ILD structure 132 as shown in FIG. 6E, in accordance with some embodiments. The dummy gate structure 220 is removed by performing a first etching process and a second etching process. The dummy gate electrode layer 208 is removed by the first etching process, and the dummy gate dielectric layer 210 is removed by the second etching process. In some embodiments, the first etching process is a dry etching process and the second etching process is a wet etching process. In some embodiments, the dry etching process includes using an etching gas, such as $CF_4$, Ar, $NF_3$, $Cl_2$, He, HBr, $O_2$, $N_2$, $CH_3F$, $CH_4$, $CH_2F_2$, or a combination thereof.

While the dummy gate structure 220 is removed, if the gap between first height $H_1$ and the second height $H_2$ is larger than 4 nm, the removed height of the dummy gate structure 220 in the first region 10 may not the same with that in the second region 20. As a result, the dummy gate structure 220 in the first region 10 is completely removed, but some of the dummy gate structure 220 are still remaining in the second region 20. The depth of the trenches 133 in the first region 10 is not equal to that in the second region 20. If some of the dummy gate structures 120 are remaining in the second region 20, it is not beneficial to fill the real gate dielectric layer and real gate electrode layer which are formed later.

It should be noted that, in contrast to the embodiment above, the gap between the first fin structures 110a and the second fin structures 110b is maintained in a range from about 0.4 nm to about 4 nm, and the etched depth of the dummy gate structure 220 in the first region 10 is substantially equal to that in the second region 20. It is advantageous to fill the real gate dielectric layer (such as gate dielectric layer 140) and real gate electrode layer (such as gate electrode layer 142) which are formed later shown in FIG. 6F.

Figure 6F:
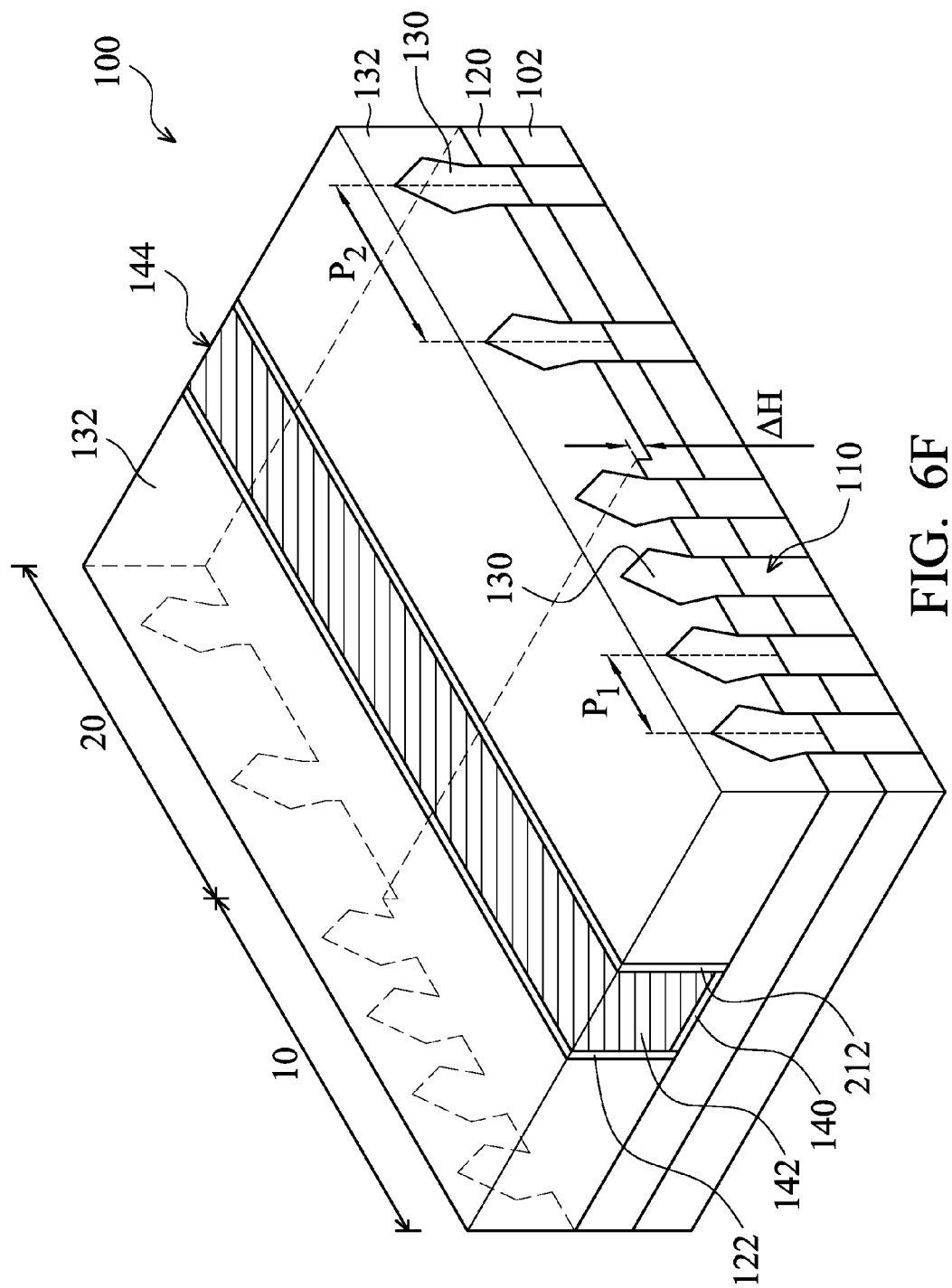

After the trenches 133 are formed, a gate dielectric layer 140 and a gate electrode layer 142 are filled into the trenches 133 as shown in FIG. 6F, in accordance with some embodiments. Therefore, a gate structure 144 including the gate dielectric layer 140 and the gate electrode layer 142 is obtained.

In some embodiments, the gate dielectric layer 140 is made of a high-k dielectric material. The high-k dielectric material may include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or the like.

In some embodiments, the gate electrode layer 142 is made of a metal material. The metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or combinations thereof. The P-work-function metal includes titanium nitride (TiN), tungsten nitride (WN), tantalum nitride (TaN), ruthenium (Ru) or combinations thereof.

As shown in FIG. 6F, the gate structure 144 is transversely overlying a middle portion of the fin structure 110. A channel region is formed below the gate structure 144, and the channel region is wrapped by the gate structure 144.

Embodiments for forming a fin field effect transistor (FinFET) device structure are provided. A fin structure is formed on a substrate with a first region and a second region, and an isolation structure is formed on the substrate. The first fin structures are formed on the first region, and the second fin structures are formed on the second region, and the number of first fin structures is greater than the number of second fin structures. In order to reduce the loading effect, during the fabrication of the first fin structures and the second fin structures, a sacrificial layer is over-deposited on the first fin structures, the second fin structures and the isolation structure. In other words, the deposition thickness of the sacrificial layer is a higher-than-normal thickness (may be about 5 nm less). As a result, the first fin structures have a first height, the second fin structures have a second height, and a gap between the first height and the second height is maintained within a range from about 0.4 nm to about 4 nm.

Since the loading effect is reduced, the height difference between the first height and the second height is also reduced. When the height difference is reduced, the uniformity of the height of the first and the second fin structures is improved. Therefore, the performance of the FinFET structure is improved.

In some embodiments, a fin field effect transistor (FinFET) device structure is provided. The FinFET device structure includes a substrate, and the substrate includes a first region and a second region. The FinFET device structure includes an isolation structure formed on the substrate and first fin structures formed on the first region. The FinFET device structure also includes second fin structures formed on the second region, and the number of first fin structures is greater than the number of second fin structures. The first fin structures have a first height which is measured from a top surface of the isolation structure to a top surface of the first fin structures, the second fin structures have a second height which is measured from a top surface of the isolation structure to a top surface of the second fin structures, and a gap between the first height and the second height is in a range from about 0.4 nm to about 4 nm.

In some embodiments, a fin field effect transistor (FinFET) device structure is provided. The FinFET device structure includes a substrate, and the substrate includes a first region and a second region. The FinFET device structure includes first fin structures formed on the substrate in the first region and second fin structures formed on the substrate in the second region. The FinFET device structure further includes an isolation structure formed on the substrate, wherein the isolation structures include a first portion located between two adjacent first fin structures and a second portion located between two adjacent second fin structures. A gap between a top surface of the first portion and a top surface of the second portion is in a range from about 0.4 nm to about 4 nm.

In some embodiments, a method for forming a fin field effect transistor (FinFET) device structure is provided. The method includes providing a substrate, and the substrate has a first region and a second region. The method also includes forming the first fin structures and the second fin structures on the first region and the second region, respectively, and the number of the first fin structures is greater than the number of the second fin structure. The method further includes forming a sacrificial layer on the first fin structures and the second fin structures, and a first thickness which is measured from a top surface of the first fin structures to a top surface of the sacrificial layer, and the first thickness is in a range from about 10 nm to about 50 nm. The method includes performing an etching process to the sacrificial layer to form an isolation structure on the substrate, and wherein the first fin structures have a first height which is measured from a top surface of the isolation structure to a top surface of the first fin structures, the second fin structures have a second height which is measured from a top surface of the isolation structure to a top surface of the second fin structures, and a gap between the first height and the second height is in a range from about 0.4 nm to about 4 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET) device structure, comprising:
    a substrate, wherein the substrate comprises a first region and a second region;
    an isolation structure formed on the substrate;
    first fin structures formed on the first region,
    second fin structures formed on the second region, wherein the number of the first fin structures is greater than the number of the second fin structures; and
    remaining fin structures formed on the second region, wherein the remaining fin structures are completely covered by the isolation structure;
    wherein the first fin structures have a first height which is measured from a top surface of the isolation structure to a top surface of the first fin structures;
    the second fin structures have a second height which is measured from a top surface of the isolation structure to a top surface of the second fin structures, and
    a gap between the first height and the second height is in a range from about 0.4 nm to about 4 nm.

2. The fin field effect transistor (FinFET) device structure as claimed in claim 1, wherein the top surface of the first fin structures is level with the top surface of the second fin structures.

3. The fin field effect transistor (FinFET) device structure as claimed in claim 1, wherein the first height is in a range from about 10 nm to about 50 nm.

4. The fin field effect transistor (FinFET) device structure as claimed in claim 1, wherein two adjacent first fin structures have a first pitch, two adjacent second fin structures have a second pitch, and the second pitch is greater than the first pitch.

5. The fin field effect transistor (FinFET) device structure as claimed in claim 1, wherein two adjacent first fin structures have a first pitch, two adjacent second fin structures have a second pitch, and the second pitch is equal to the first pitch.

6. The fin field effect transistor (FinFET) device structure as claimed in claim 1, further comprising:
    a first gate structure formed on a middle portion of the first fin structures; and
    a second gate structure formed on a middle portion of the second fin structures, wherein a top surface of the first gate structure is level with a top surface of the second gate structure.

7. The fin field effect transistor (FinFET) device structure as claimed in claim 1, wherein the gap between the first height and the second height is in a range from about 1 nm to about 3 nm.

8. A fin field effect transistor (FinFET) device structure, comprising:
    a substrate, wherein the substrate comprises a first region and a second region;
    first fin structures formed on the substrate in the first region;
    second fin structures formed on the substrate in the second region;
    remaining fin structures formed on the second region, wherein the remaining fin structures are covered by the isolation structure; and
    an isolation structure formed on the substrate, wherein the isolation structures comprise a first portion located between two adjacent first fin structures and a second portion located between two adjacent second fin structures, and
    wherein a gap between a top surface of the first portion and a top surface of the second portion is in a range from about 0.4 nm to about 4 nm.

9. The fin field effect transistor (FinFET) device structure as claimed in claim 8, further comprising:
    a gate structure formed on a middle portion of the first fin structures and the second fin structures, wherein the gate structure comprises a high-k dielectric layer and a metal gate electrode layer formed on the high-k dielectric layer.

10. The fin field effect transistor (FinFET) device structure as claimed in claim 8, wherein two adjacent first fin structures have a first pitch, two adjacent second fin structures have a second pitch, and the second pitch is greater than the first pitch.

11. The fin field effect transistor (FinFET) device structure as claimed in claim 8, further comprising:
    a source/drain (S/D) structure adjacent to the gate structure; and
    an inter-layer dielectric (ILD) structure formed on the S/D structures and on the substrate.

12. A method for forming a fin field effect transistor (FinFET) device structure, comprising:
    providing a substrate, wherein the substrate has a first region and a second region;
    forming the first fin structures and the second fin structures on the first region and the second region, respectively, wherein the number of the first fin structures is greater than the number of the second fin structure;
    forming a sacrificial layer on the first fin structures and the second fin structures, wherein a first thickness which is measured from a top surface of the first fin structures to a top surface of the sacrificial layer, and wherein the first thickness is in a range from about 10 nm to about 50 nm; and
    performing an etching process to the sacrificial layer to form an isolation structure on the substrate,
    wherein the first fin structures have a first height which is measured from a top surface of the isolation structure to a top surface of the first fin structures,
    the second fin structures have a second height which is measured from a top surface of the isolation structure to a top surface of the second fin structures, and
    a gap between the first height and the second height is in a range from about 0.4 nm to about 4 nm.

13. The method for forming the fin field effect transistor (FinFET) device structure as claimed in claim 12, before forming the sacrificial layer on the first fin structures and the second fin structures, further comprising:
    forming a dielectric layer on the first fin structures and the second fin structures; and thinning the dielectric layer to expose a top surface of the hard mask layer, such that a top surface of the dielectric layer is level with a top surface of the hard mask layer.

14. The method for forming the fin field effect transistor (FinFET) device structure as claimed in claim 12, wherein forming the first fin structures and the second fin structures on the first region and the second region comprises:
    forming the first fin structures in the first region and the second fin structures in the second region, wherein the number of the first fin structures is the same as the number of the second fin structures; and
    removing a portion of the second fin structures, such that the number of the first fin structures is greater than the number of the second fin structures.

15. The method for forming the fin field effect transistor (FinFET) device structure as claimed in claim 12, further comprising:
    forming a gate structure on a middle portion of the first fin structures and the second fin structures.

16. The method for forming the fin field effect transistor (FinFET) device structure as claimed in claim 12, further comprising:
    forming a dummy gate structure on a middle portion of the first fin structures and the second fin structures;
    removing the top portion of the first fin structures to form a cavity;
    forming a source/drain structure in the cavity and on the cavity;
    forming the inter-layer dielectric (ILD) structure on the S/D structure and the dummy gate structure.

17. The method for forming the fin field effect transistor (FinFET) device structure as claimed in claim 12, further comprising:
    removing the dummy gate structure to form a trench;
    forming a high-k dielectric layer in the trench; and
    forming a metal gate electrode layer on the high-k dielectric layer.

18. The method for forming the fin field effect transistor (FinFET) device structure as claimed in claim 12, wherein forming the first fin structures and the second fin structures on the first region and the second region, respectively comprises:
    forming a pad layer on the substrate;
    forming a hard mask layer on the pad layer;
    forming a photoresist layer on the hard mask layer;
    patterning the photoresist layer to form a patterned photoresist layer; and
    patterning the hard mask layer and the pad layer by using the patterned photoresist layer as a mask to form the patterned hard mask layer and the patterned pad layer;
    etching a portion of the substrate by using the patterned hard mask layer and the patterned pad layer as a mask.

19. The method for forming the fin field effect transistor (FinFET) device structure as claimed in claim 18, further comprising:
    removing the hard mask layer and the pad layer to form recesses; and
    forming the sacrificial layer in the recesses.

\* \* \* \* \*